United States Patent
Yong et al.

(10) Patent No.: US 11,563,419 B1
(45) Date of Patent: Jan. 24, 2023

(54) PIEZOELECTRIC RESONATOR WITH MULTIPLE ELECTRODE SECTIONS

(71) Applicant: HRL Laboratories, LLC, Malibu, CA (US)

(72) Inventors: Yook-Kong Yong, Princeton, NJ (US); Randall L. Kubena, Oak Park, CA (US); Deborah J. Kirby, Calabasas, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 755 days.

(21) Appl. No.: 16/543,409

(22) Filed: Aug. 16, 2019

Related U.S. Application Data (60) Provisional application No. 62/747,648, filed on Oct. 18, 2018.

(51) Int. Cl.
H01L 41/08 (2006.01)
H03H 9/17 (2006.01)

(52) U.S. Cl.
CPC ............ *H03H 9/178* (2013.01); *H03H 9/173* (2013.01)

(58) Field of Classification Search
CPC ........ H03H 9/178; H03H 9/173; H03H 9/172; H03H 9/19
See application file for complete search history.

(56) References Cited

U.S. PATENT DOCUMENTS

| | | | | |
|---|---|---|---|---|
| 5,760,664 | A * | 6/1998 | Allen | H03H 9/25 333/194 |
| 6,174,051 | B1 * | 1/2001 | Sakaida | B41J 2/14209 347/72 |
| 6,903,629 | B1 | 6/2005 | Ballato et al. | |
| 7,579,753 | B2 * | 8/2009 | Fazzio | H04R 17/02 310/366 |
| 8,305,154 | B1 * | 11/2012 | Kubena | H03H 9/0542 310/333 |
| 8,567,041 | B1 | 10/2013 | Roper | |
| 9,167,351 | B1 | 10/2015 | Roper | |
| 9,240,767 | B2 * | 1/2016 | Burgess | H03H 9/175 |

(Continued)

OTHER PUBLICATIONS

A.N. Lepetaev & A.V. Kosykh, Omsk State Technical University, Russia; "New method of multy-mode oscillations control in crystal resonators", 2012 IEEE International Frequency Control Symposium, IFCS 2012, Proceedings 6243743, pp. 141-144.

*Primary Examiner* — Tuan Pham
(74) *Attorney, Agent, or Firm* — Ladas & Parry, LLP (57) ABSTRACT

A resonator includes a piezoelectric layer comprising a piezoelectric material, the piezoelectric layer having a first surface and a second surface; an inner electrode disposed on the first surface of the piezoelectric layer, the inner electrode connected to a circuit; and an outer electrode surrounding the inner electrode on the first surface of the piezoelectric layer, the outer electrode left floating or connected to ground. The inner electrode and the outer electrode are separated by at least one gap smaller than an acoustic wavelength. One single piece electrode or multiple piece electrodes may be disposed on the second surface of the piezoelectric layer. The outer electrodes are configured for optimal modal confinement of an acoustic resonance while the inner electrodes are configured to produce a higher motional resistance than the interconnect resistance for maintaining high Q.

20 Claims, 11 Drawing Sheets

(56) References Cited

U.S. PATENT DOCUMENTS

2011/0080069 A1* 4/2011 Cueff ............... H01L 41/29
 29/25.35
2012/0274184 A1* 11/2012 Stephanou .......... H03H 9/0207
 29/25.35

* cited by examiner

PIEZOELECTRIC RESONATOR WITH MULTIPLE ELECTRODE SECTIONS

STATEMENT REGARDING FEDERALLY SPONSORED RESEARCH OR DEVELOPMENT

This invention was made with support from the United States Government under contract number HR0011-16-C-0123 awarded by the Defense Advanced Research Project Agency (DARPA) contract. The United States Government has certain rights in the invention.

CROSS REFERENCE TO RELATED PATENT AND APPLICATIONS

This application is related to U.S. patent application Ser. No. 13/161,118, filed on Jun. 15, 2011 (now U.S. Pat. No. 8,567,041), the disclosure of which is hereby incorporated by reference in its entirety. This application is also related to U.S. patent application Ser. No. 13/968,218, filed on Aug. 15, 2013 (now U.S. Pat. No. 9,167,351), the disclosure of which is hereby incorporated by reference in its entirety. This application claims the benefit of and is a non-provisional patent application of U.S. Provisional Application No. 62/747,648, filed on Oct. 18, 2018, the entirety of which is hereby incorporated by reference

TECHNICAL FIELD

The present disclosure generally relates to resonators. More specifically, certain embodiments of the present disclosure relate to piezoelectric resonators having electrodes fabricated in two or more sections for optimizing modal confinement and frequency over temperature profile while allowing motional resistance of the resonator ($R_1$) to be adjusted independently.

BACKGROUND

Piezoelectric resonators are used for oscillators or sensing devices. In particular, a piezoelectric resonator can be used as an oscillator for a clock or any other application which requires small size, low cost, and ruggedness. The piezoelectric resonator can also be used for microprocessor applications. A piezoelectric resonator operates by resonating in response to a stimulus, which may be a physical event, such as acceleration or force or pressure, or an electrical signal. In the former usage, the resonator acts as a transducer, and in the latter case the resonator acts as a frequency source.

Prior resonators have been constructed in a number of ways. Oven controlled crystal oscillators (OCXO) are one of several well-known piezoelectric resonators in the industry. Although the discussion which follows highlights OCXOs for concreteness, the present disclosure is not limited in its application to OXCOs and is broadly applicable to piezoelectric resonators, in general. Generally, crystal resonators resonate at a frequency which varies with temperature. The magnitude of this variation is frequently controlled by using temperature compensation (TCXO) or by ovenizing the resonator by controlling the temperature of the resonator (OCXO). Heat is typically supplied by transistors or resistors through conduction. Small low power OCXOs are desired for many military and commercial markets such as small navigation systems, small atomic clocks, radar, and underwater exploration. Low phase noise and Allan Deviation (high stability) may be important for precise clock applications. In some conventional OCXOs, the piezoelectric resonator element is enclosed in a case having a heater. For example, some quartz resonators are packaged in metal-type cans (TO5 or TO8) and sealed in vacuums using cold weld or seam welding bonding. The sealed cans may be heated using a transistor and metal heat spreading rings. The resonators may be attached to a heated interposer substrate with an on-board temperature sensor (Magic Xtal) and the interposer may be clipped inside the can (e.g. TO8) for vacuum sealing. U.S. Pat. No. 9,167,351 discloses a heated quartz crystal oscillator having a number of regions: an active resonating region, a heater region, a strain relief suspension region that joins the active resonating region to the heater region, and a via and bond pad region that is joined to the heater region by a thermal resistive region.

Some conventional OCXO resonator designs have long traces or strips of interconnect metal from the resonator to the base substrate to be connected to the sustaining circuit. These long traces may lead to an effective increase in the motional resistance of the resonator (as defined by the traditional Van Dyke model of the resonator) and may contribute to a loss of quality factor (Q). That is, the resistance of the traces, when combined with the inherent motional resistance ($R_1$) of the resonator, leads to an effective increase in the inherent motional resistance and a degradation of the quality factor Q. However, the quality factor Q is one of the most important parameters for improving the stability of the clock. For example, in an existing 32-MHz VHF SC-cut OCXO quartz resonator, the interconnects along the tethers can have resistance values near the values of the inherent motional resistance $R_1$ of the resonator (near 7 ohms). It followed that increasing the inherent motional resistance $R_1$ of the resonator to be roughly five times greater than the interconnect resistance was needed to maintain the inherent high quality factor Q of the resonator.

U.S. Pat. No. 6,903,629 teaches double-sided, single-sided and ring electrode mesa resonators with an electrode-free resonator area that serves as an energy-trapping area.

A. N. Lepetaev & A. V. Kosykh, "New method of multy-mode oscillations control in crystal resonators" 2012 IEEE International Frequency Control Symposium, IFCS 2012, Proceedings 6243743, pp. 141-144, suppresses the charge collection of one mode of the oscillation compared to the other modes by varying the geometry of a contiguous metal electrode. The SC-cut motional resistance of the temperature sensitive mode (B mode) is enhanced compared to the temperature and stress compensated mode (C mode).

Further limitations and disadvantages of conventional and transitional approaches will become apparent to one of skill in the art, through comparison of such systems with some aspects of the present disclosure as set forth in the remainder of the present disclosure.

SUMMARY

The features and advantages of the present disclosure will be more readily understood and apparent from the following detailed description, which should be read in conjunction with the accompanying drawings, and from the claims which are appended to the end of the detailed description.

According to some embodiments of the present disclosure, a resonator may comprise a piezoelectric layer comprising a piezoelectric material, the piezoelectric layer having a first surface and a second surface; an inner electrode disposed on the first surface of the piezoelectric layer, the inner electrode connected to a circuit; and an outer electrode surrounding the inner electrode on the first surface of the piezoelectric layer, the outer electrode left floating or connected to ground. According to various embodiments of the present disclosure, the resonator is designed so that the combination of the inner and outer electrodes can provide modal confinement of the mechanical mode through mass loading while only the inner electrode collects piezoelectrically-driven surface charge which is connected to the circuit (also known as a sustaining circuit). Thus, the impedance or motional resistance of the resonator can be independently optimized with respect to the geometry of the electrodes needed for best modal confinement. In some embodiments, the piezoelectric material may comprise quartz, aluminum nitride or lithium niobate. According to an embodiment of this disclosure, the first and second surfaces can be parallel, opposed surfaces of the piezoelectric layer.

Preferably, the inner electrode and the outer electrode may be separated by at least one first gap smaller than an acoustic wavelength. In exemplary embodiments, the at least one first gap between the inner electrode and the outer electrode is 10 µm or less.

In certain embodiments, the resonator may further comprise an other electrode disposed on the second surface of the piezoelectric layer, the other electrode left floating or connected to ground. The outer electrode on the first surface of the piezoelectric layer and the other electrode on the second surface of the piezoelectric layer may be electrically connected. In some implementations, the resonator may further comprise a via formed through the piezoelectric layer to electrically connect the outer electrode on the first surface of the piezoelectric layer to the other electrode on the second surface of the piezoelectric layer.

According to other embodiments, the resonator may further comprise an other inner electrode disposed on the second surface of the piezoelectric layer, the other inner electrode connected to the circuit; and an other outer electrode surrounding the other inner electrode on the second surface of the piezoelectric layer, the other outer electrode left floating or connected to ground. The other inner electrode and the other outer electrode may be separated by at least one second gap smaller than the acoustic wavelength. The second gap of the second surface of the piezoelectric layer may be the same as or different from the first gap of the first surface of the piezoelectric layer. Additionally, the outer electrode on the first surface of the piezoelectric layer and the other outer electrode on the second surface of the piezoelectric layer may be electrically connected. In some implementations, the resonator may further comprise a via formed through the piezoelectric layer to electrically connect the outer electrode on the first surface of the piezoelectric layer to the other outer electrode on the second surface of the piezoelectric layer.

In various embodiments, the piezoelectric layer comprises at least one mesa which is a raised region of the piezoelectric layer on the first or second surface. The at least one mesa may have the same length and width as the outer electrode.

In some embodiments, the outer electrode may have a structure formed or arranged such that a lead connecting the inner electrode and the circuit can extend through the outer electrode from the inner electrode to the circuit. The structure of the outer electrode may be formed as a discontinuous part or a groove.

Optionally, the resonator may further comprise a heater and/or a temperature sensor disposed on the first or second surface of the piezoelectric layer. The piezoelectric layer can comprise a tether suspending a structure of the piezoelectric layer, the tether having a bent or curved shape.

A better understanding of the nature and advantages of the present disclosure may be gained with reference to the detailed description and the drawings below.

BRIEF DESCRIPTION OF THE DRAWINGS

Various embodiments in accordance with the present disclosure will be described with reference to the drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the invention. The following detailed description is therefore not to be taken in a limiting sense, and the scope of the invention is defined only by the appended claims and equivalents thereof. Like numbers in the figures refer to like components, which should be apparent from the context of use.

Figure 1:
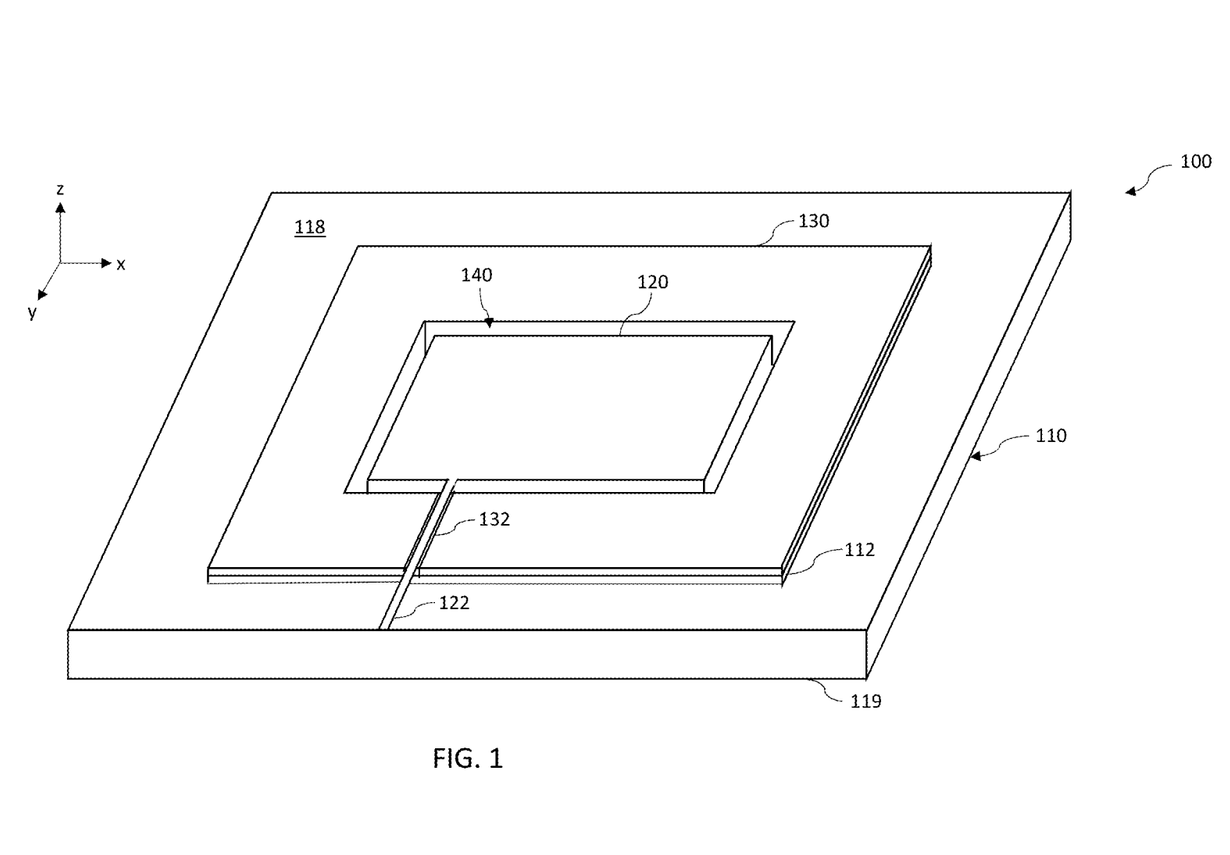
FIG. 1 shows a simplified schematic view of a resonator in accordance with an embodiment of the present disclosure.

FIG. 1 shows a simplified schematic view of a resonator 100 in accordance with an embodiment of the present disclosure. The resonator 100 may be, for example, but not limited to, an oven-controlled crystal oscillator (OCXO) or any resonator having a piezoelectric substrate. The reference numbers used in FIG. 1 are used for the same components in other figures, including FIGS. 2-4.

The resonator 100 includes a piezoelectric layer 110. The piezoelectric layer 110 may include a piezoelectric material such as quartz, although other piezoelectric materials, such as lithium niobate, lithium tantalate, aluminum nitride, zinc oxide, langasite, barium titanate, lead magnesium niobate-lead titanate crystal, and lead zinc niobate-lead titanate crystal, may also be implemented. For example, the piezoelectric layer 110 may comprise a unitary piece of quartz that may be micromachined to have a number of regions if appropriate. Generally, the thickness of the piezoelectric layer 110 and electrode metal properties may determine the resonator frequency. In an exemplary embodiment, the piezoelectric material may be implemented as SC-cut quartz and the resonator may be configured to operate in a shear-mode fashion.

The piezoelectric layer 110 may have a top surface 118 and a bottom surface 119. At least one of the top surface 118 and the bottom surface 119 of the piezoelectric layer 110 is patterned with two or more electrodes. A single-electrode design which is reduced in size to increase the motional resistance $R_1$ may increase the number of activity dips in the f/T profiles and may also produce lower quality factor Q because the mass loading from the single electrode may reduce the modal confinement. Therefore, multiple electrodes, comprising a separate electrode section for charge collection which determines the inherent motional resistance $R_1$, may be needed to optimize mass loading and modal confinement. Two or more electrodes may be fabricated on both the top surface 118 and the bottom surface 119 of the piezoelectric layer 110. However, only one of the top surface 118 and the bottom surface 119 of the piezoelectric layer 110 may have multiple electrode patterns while the other surface of the piezoelectric layer 110 opposing the one surface of the piezoelectric layer 110 may be patterned with a single piece electrode.

In an exemplary embodiment shown in FIG. 1, the top surface 118 of the piezoelectric layer 110 is fabricated with two electrodes, a first inner electrode 120 and a first outer electrode 130. In a first exemplary embodiment shown in FIGS. 2A-2C, one piece of a bottom electrode 150 is disposed on the bottom surface 119 of the piezoelectric layer 110. Alternatively, in a second exemplary embodiment illustrated in FIGS. 3A-3C, two or more pieces of electrodes, such as a second inner electrode 125 and a second outer electrode 135, are patterned on the bottom surface 119 of the piezoelectric layer 110. The electrodes 120, 125, 130, 135 and 150 may be gold (Au) or aluminum (Al), platinum, molybdenum, silver, nickel, ruthenium, or any other appropriate conductive material.

Figure 4A:
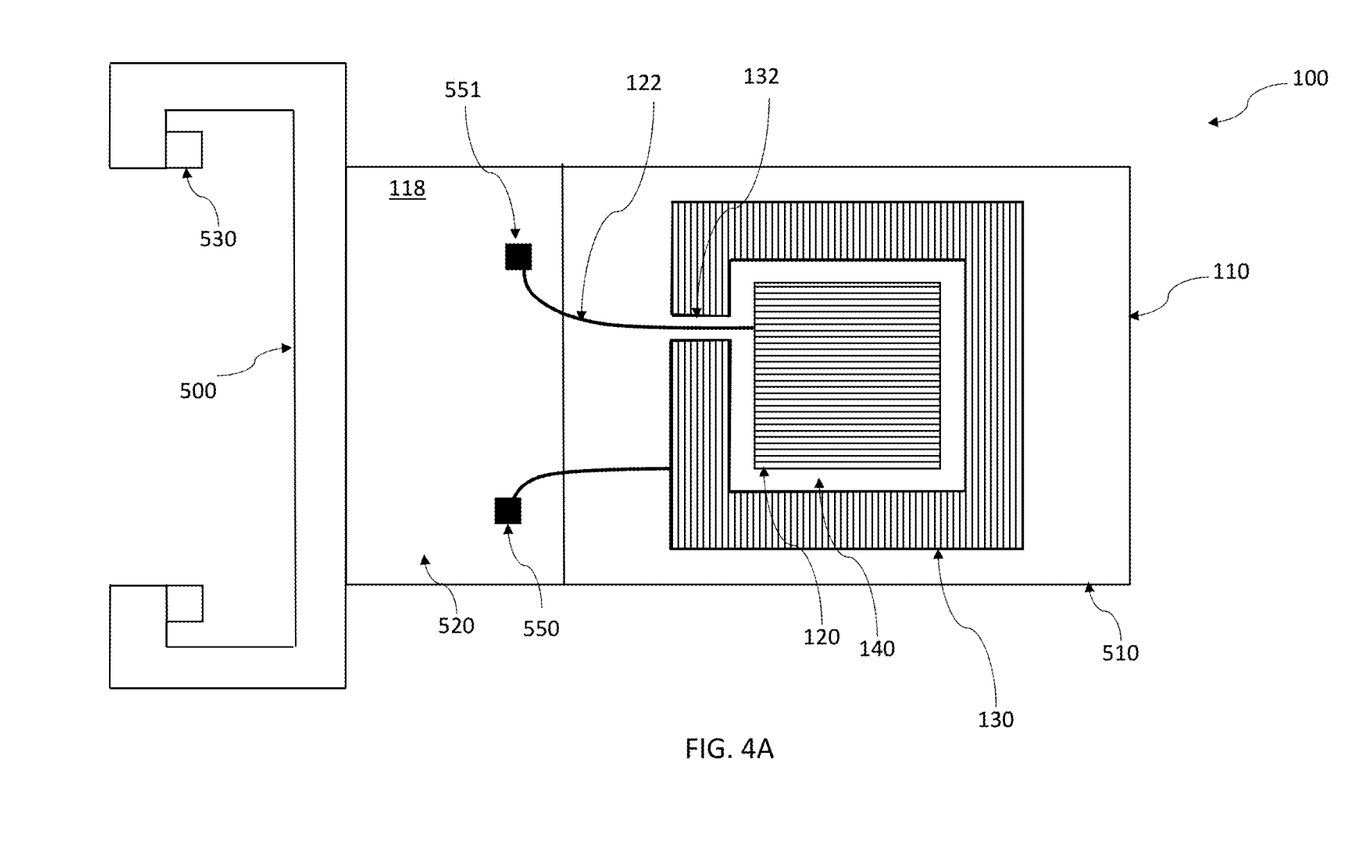
FIG. 4A is a top plan view the resonator with a tether according to another embodiment of the present disclosure.
Figure 4B:
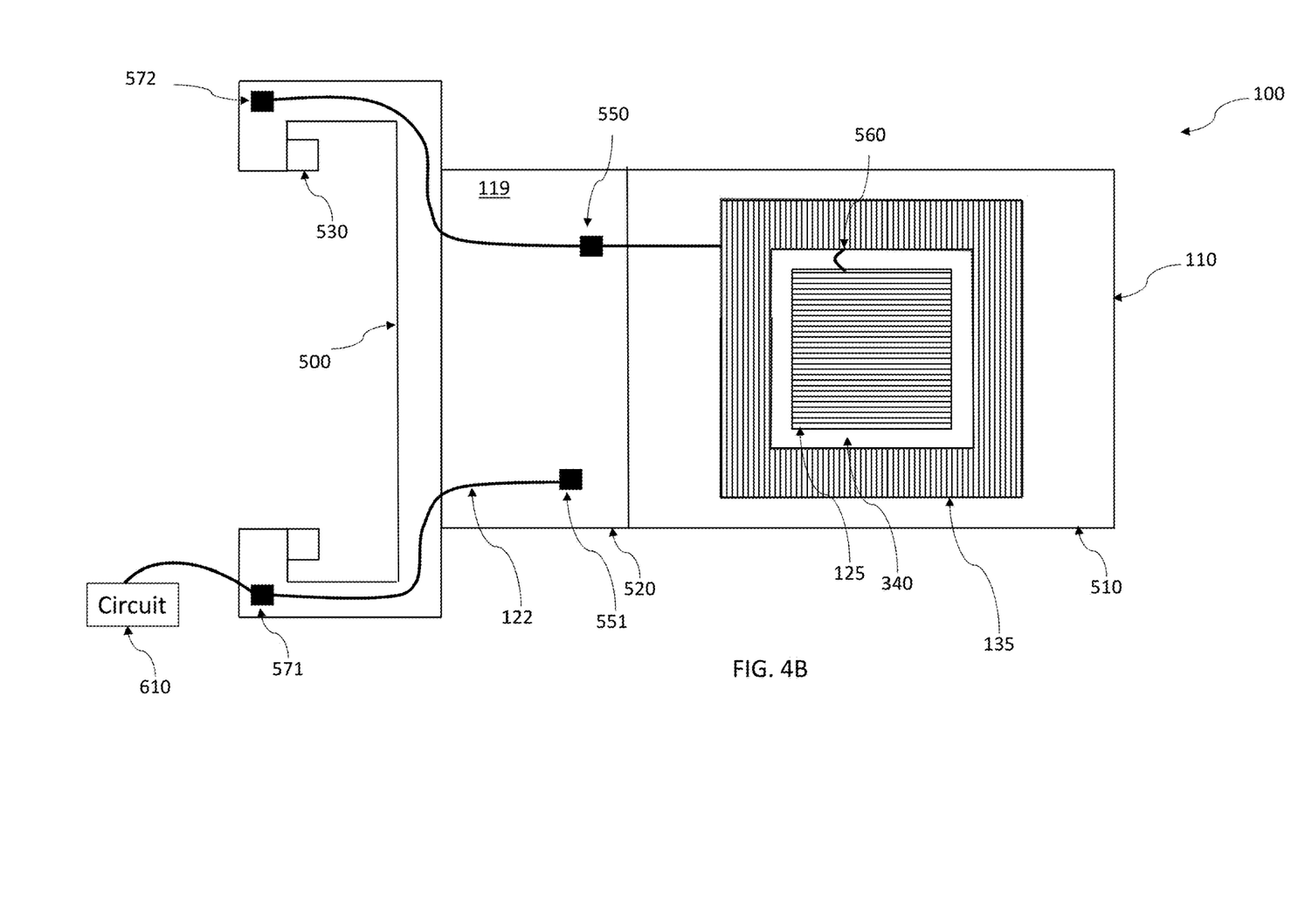
FIG. 4B is a bottom plan view the resonator with the tether according to another embodiment of the present disclosure.

The first inner electrode 120 may be coupled or affixed to the top surface 118 of the piezoelectric layer 110. The first inner electrode 120 may be connected to a circuit 610 such as shown in FIG. 4B, and may be used for charge collection and signal amplification to sustain a piezoelectric resonance. The size of the first inner electrode 120 may determine a motional resistance $R_1$ of the resonator 100. For example, the length (dimension in the x-direction) of the first inner electrode 120 may be half of the length (dimension in the x-direction) of the first outer electrode 130, and the width (dimension in the y-direction) of the first inner electrode 120 may be 0.4 of the width (dimension in the y-direction) of the first outer electrode 130. The thickness (dimension in the z-direction) of the first inner electrode 120 may be, for example, but not limited to, 0.03 to 0.5 μm.

The first outer electrode 130 may surround a part or a whole of the first inner electrode 120. The first outer electrode 130 may be left electrically floating or may be connected to electrical ground. In an exemplary embodiment, in which the piezoelectric layer 110 has a length (x) of 1980 μm and a width (y) of 1860 μm, the first outer electrode 130 may have a length (x) of 1715 μm and a width (y) of 1495 μm. In another exemplary embodiment, in which the piezoelectric layer 110 may have a length (x) of 2035 μm and a width (y) of 1900 μm, the first outer electrode 130 may have a length (x) of 1700 μm and a width (y) of 1193 μm. The thickness (z) of the first outer electrode 130 may be the same as, or different from, that of the first inner electrode 120, and may be, for example, 0.08 μm.

The first outer electrode 130 may have a structure 132 that lets pass through a conductive lead 122 coupling the first inner electrode 120 to the circuit 610 of FIG. 4B. The conductive lead 122 can allow the first inner electrode 120 to electrically access the circuit 610. The structure 132 of the first outer electrode 130 for the conductive lead 122 may be formed as a discontinuous part of the first outer electrode 130, a groove covered with electrically insulating material formed thereon, or any structure providing a space that allows the conductive lead 122 to extend through the first outer electrode 130 from the first inner electrode 120 to the circuit 610.

The first inner electrode 120 and the first outer electrode 130 may be separated by a gap 140. The gap 140 may be smaller than an acoustic wavelength so as not to disturb the modal pattern. For instance, the gap 140 may be 10 μm or less for a Very High Frequency (VHF) resonator.

One way to increase the inherent motional resistance of the resonator may be by decreasing the size of the electrodes used to excite the resonator. However, to get the better performance of a shear mode resonator, the size of the electrodes may need to be increased as large as possible. This inherent contradiction in design requirements of the resonator can be resolved by dividing the electrodes to have an inner region electrically isolated from an outer region yet making the inner region acoustically coupled to the outer region.

If the gap between the inner region and the outer region of the electrodes is less than the acoustic wavelength, the acoustic energy may be confined by the inner and outer regions of the electrodes yet the electrical excitation and hence the induced charge may be confined to the inner region of the electrode.

The acoustic wavelength may be the phase speed of sound in the piezoelectric material divided by the wave frequency. However, the modal displacements of an acoustic mode are three-dimensional. The wavelength of an acoustic mode along one axis may be different from its wavelength along other axes. The acoustic mode modal displacement along one axis may be larger than its displacements along the other axes. In some embodiments of the present disclosure, the acoustic wavelength may be, for example, but not limited to, a wavelength in the direction of propagation of an acoustic wave.

The acoustic wavelength may depend on an operational mode of the resonator, for example, but not limited to, a shear mode for an AT or SC cut crystal resonator, a Lame mode for a bulk acoustic wave resonator or an extensional mode for bulk acoustic wave resonator, as well as a fundamental mode or an overtone mode. For example, one or more lateral physical dimensions of the resonator (e.g., width or length) may determine the acoustic wavelength of the operational mode.

For instance, in the case of a crystal piezoelectric resonator operating in the shear mode, at the fundamental mode, the acoustic wavelength may be twice the thickness of the piezoelectric layer such as quartz. The frequency of the fundamental mode of a thickness shear mode resonator is approximately 1.6 GHz/t and the acoustic wavelength is 2*t/n, where t is the thickness of the piezoelectric layer in microns and n is an odd integer greater than or equal to 1. For example, a 40 MHz fundamental mode resonator has the thickness of quartz t of ~40 microns, and has the acoustic wavelength of 80 microns. In the case of the crystal piezoelectric resonator operating in the shear mode, at the third overtone mode (n=3), the acoustic wavelength may be one third of the acoustic wavelength of the same resonator operating in the fundamental shear mode. Both the fundamental and third overtone modes may be driven simultaneously in the resonator. In this case, the acoustic wavelength may be governed by the smaller acoustic wavelength of the third overtone mode.

A Lamé mode MEMS resonator may comprise, for example, but not limited to, a microscale square plate designed to be excited to vibrate in a particular lateral antisymmetric mode within the plane of fabrication. The Lamé mode can be seen as two opposite sides of the square plate expanding, while the other two opposite sides on the orthogonal axis contract. The corners of the square plate are nodes in the Lamé mode such that the square plate can be conveniently clamped for minimal anchor loss.

A bulk mode resonator operating in the Lamé mode may have, at the fundamental mode, an acoustic wavelength which is twice the lateral dimensions of the piezoelectric layer, that is, the width or length of a piezoelectric plate. At the third overtone mode (n=3), the acoustic wavelength may be one third of the acoustic wavelength of the same resonator operating at the fundamental Lamé mode. When the resonator is driven at both the fundamental and third overtone modes simultaneously, the acoustic wavelength may be determined by the acoustic wavelength of the third overtone mode.

In the case of the bulk mode resonator operating in the extensional mode, at the fundamental mode, the acoustic wavelength may be twice the length (x) of the piezoelectric layer 110. Similarly, the resonator operating at the third overtone of the extensional mode may have an acoustic wavelength of one third of the acoustic wavelength of the fundamental extensional mode.

Depending on the gap dimension, some fringing capacitance may be expected from the inner driven electrode 120 to the outer electrode 130 when the outer electrode 130 is grounded. This fringing capacitance may be added to the capacitance $C_o$ of the resonator 100 and may increase the $C_o/C_1$ ratio, where $C_1$ is the motional capacitance. It may also decrease the pullability of the crystal because, the fractional change in frequency over a change in the load capacitance $C_L$ is given by $\Delta(\delta f/f)/\Delta C_L = -C_1/2(C_o+C_L)^2$. However, the pulling requirement for the OCXO is small because the frequency is already stabilized by the oven to typically be less than 0.1 ppm, and therefore the fringing capacitance from the inner electrode 120 to the outer electrode 130 may not be significant.

The piezoelectric layer 110 may have a mesa 112 for extra modal confinement for a small VHF design. The mesa 112 may be formed as a raised region of the piezoelectric layer 110 as shown in FIG. 1. The length (x) and width (y) of the mesa 112 may be the same as, or different from, those of the first outer electrode 130. The thickness (z) of the mesa 112 may be, for example, but not limited to, 1-2 µm The entire electrode pattern, both the first inner electrode 120 and the first outer electrode 130, may contribute to the modal stability over temperature, and may be used for determining modal confinement, quality factor Q, resonant frequency and f/T profiles. The size of the first inner electrode 120 may determine a motional resistance $R_1$ of the resonator 100. Accordingly, by having a separate electrode determining the resonator motional resistance, the modal confinement and f/T profile can be optimized using conventional design parameters and rules, independent from the motional resistance $R_1$. The mesa 112 may be also used for extra modal confinement.

Figure 2A:
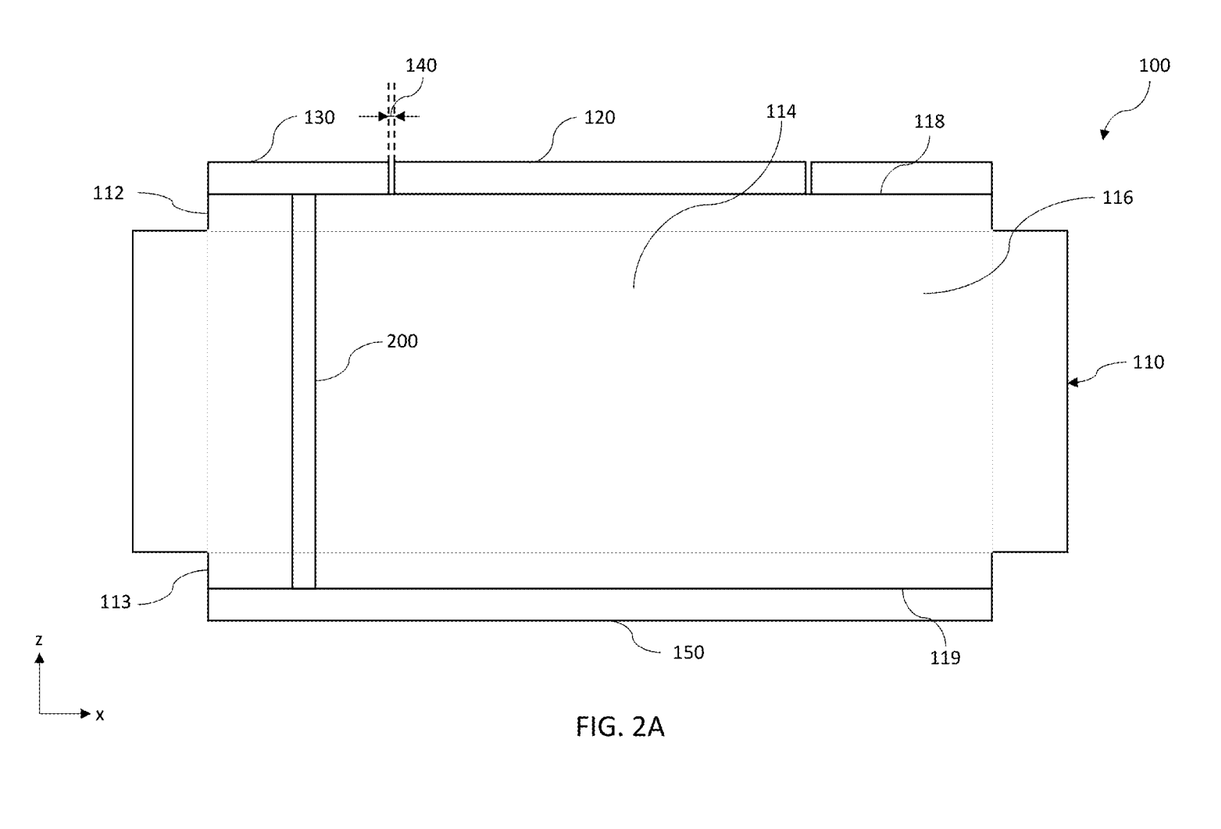
FIG. 2A is a cross-sectional view of the resonator according to a first exemplary embodiment of the present disclosure.
Figure 2B:
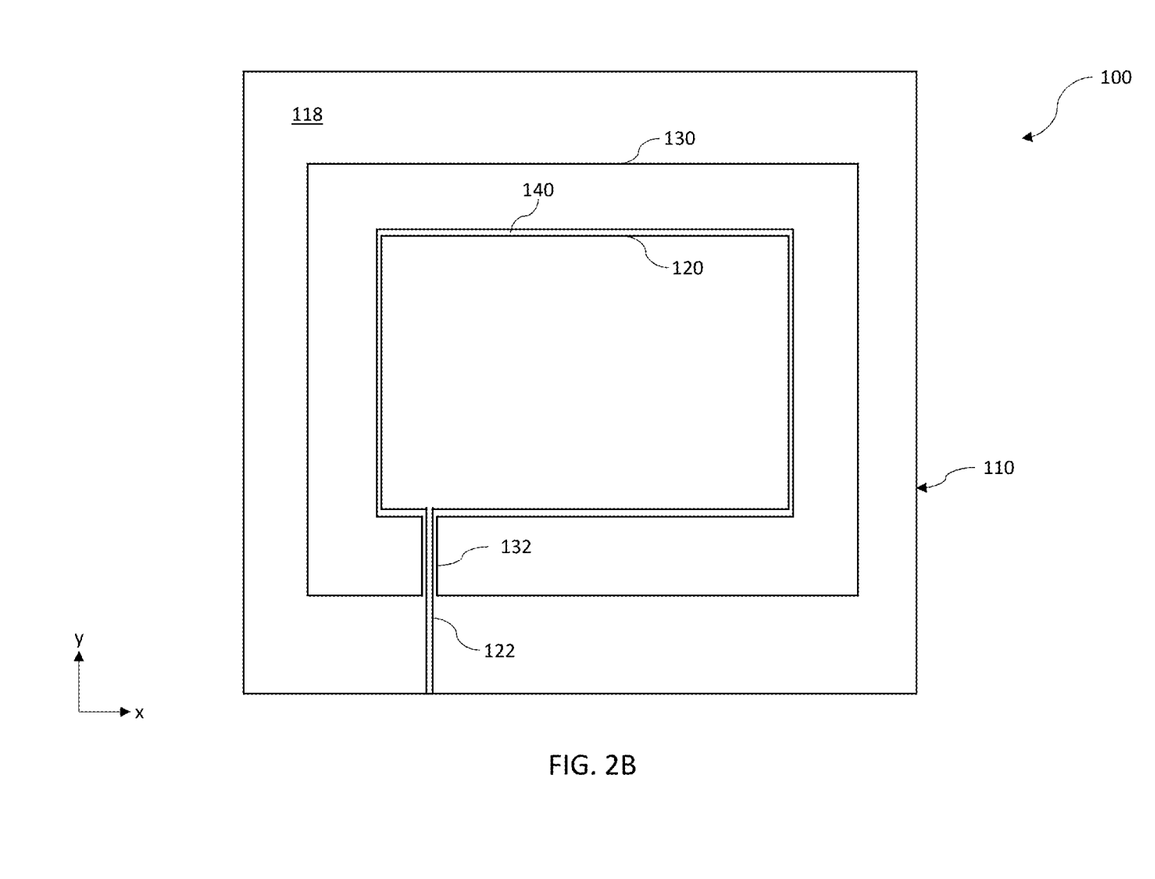
FIG. 2B is a top plan view of the resonator having one electrode on the bottom surface of a piezoelectric layer according to the first exemplary embodiment of the present disclosure.
Figure 2C:
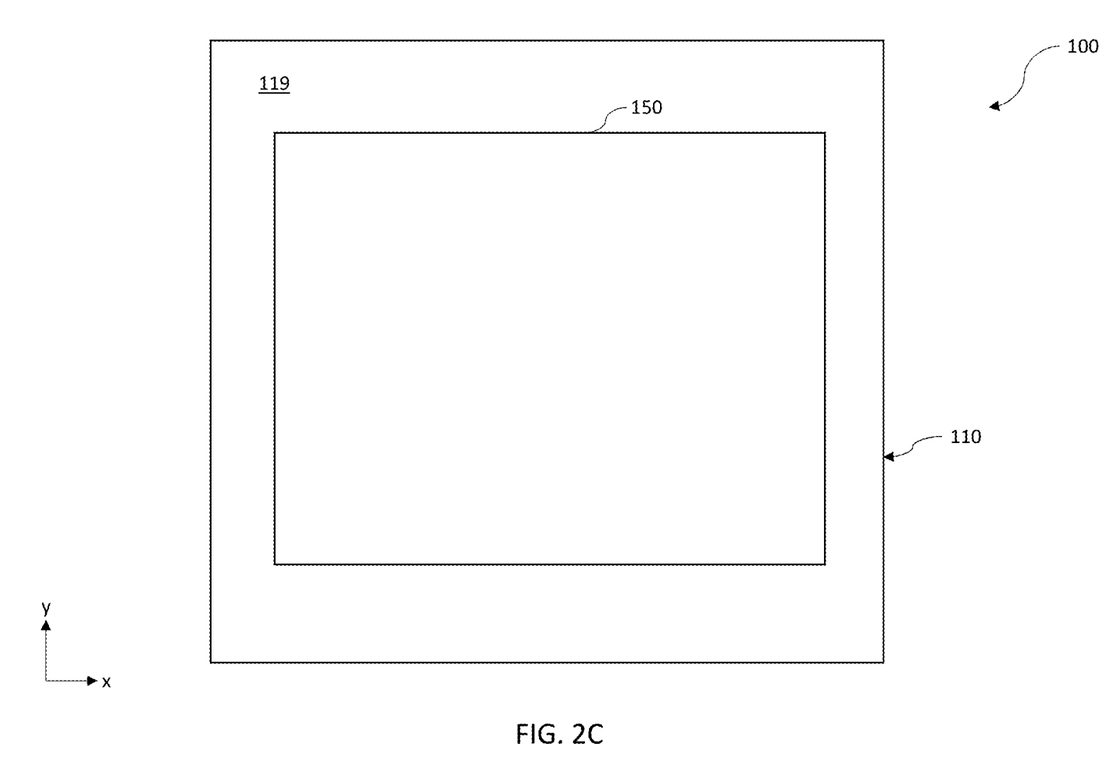
FIG. 2C is a bottom plan view of the resonator having one electrode on the bottom surface of the piezoelectric layer according to the first exemplary embodiment of the present disclosure.
Figure 3A:
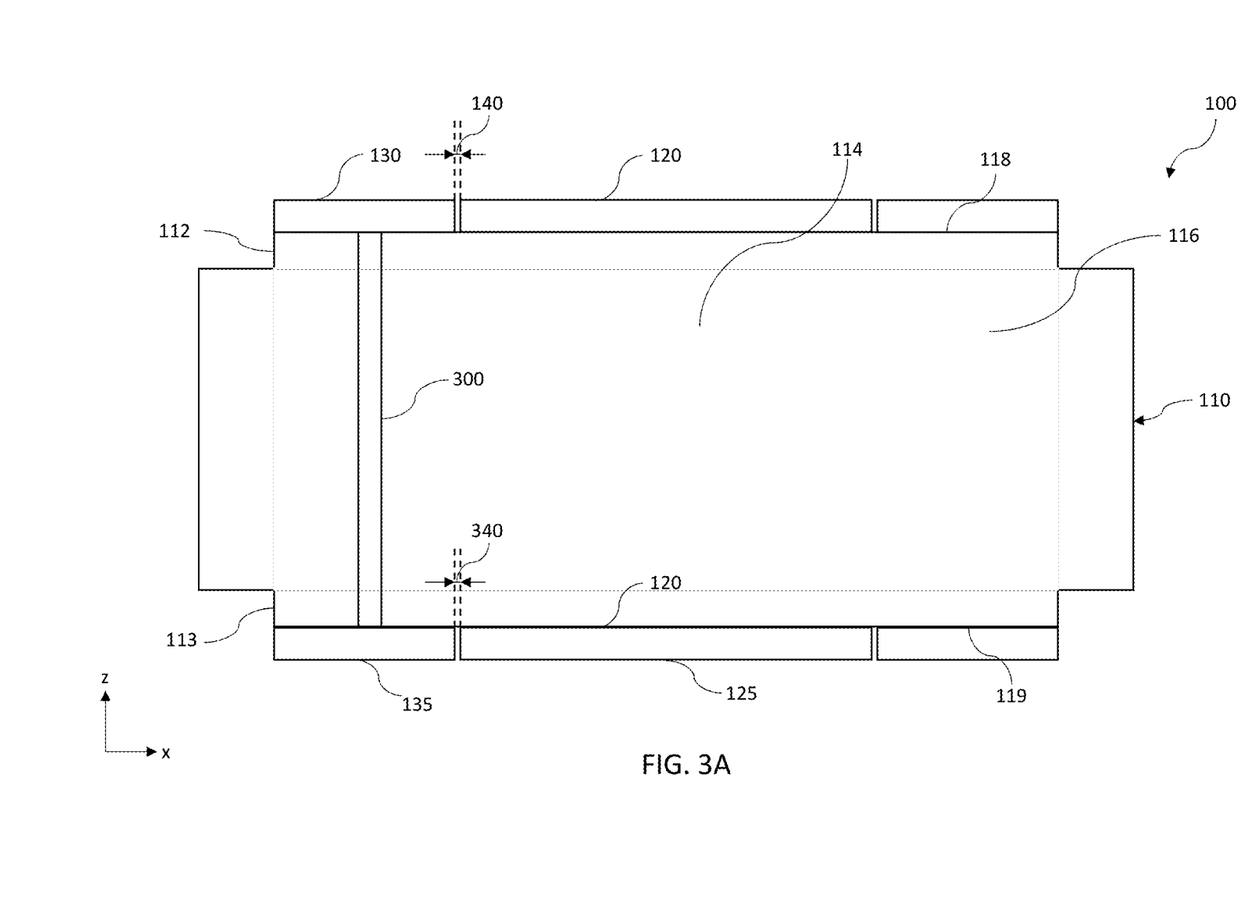
FIG. 3A is a cross-sectional view of the resonator having multiple electrodes on the bottom surface of the piezoelectric layer according to a second exemplary embodiment of the present disclosure.
Figure 3B:
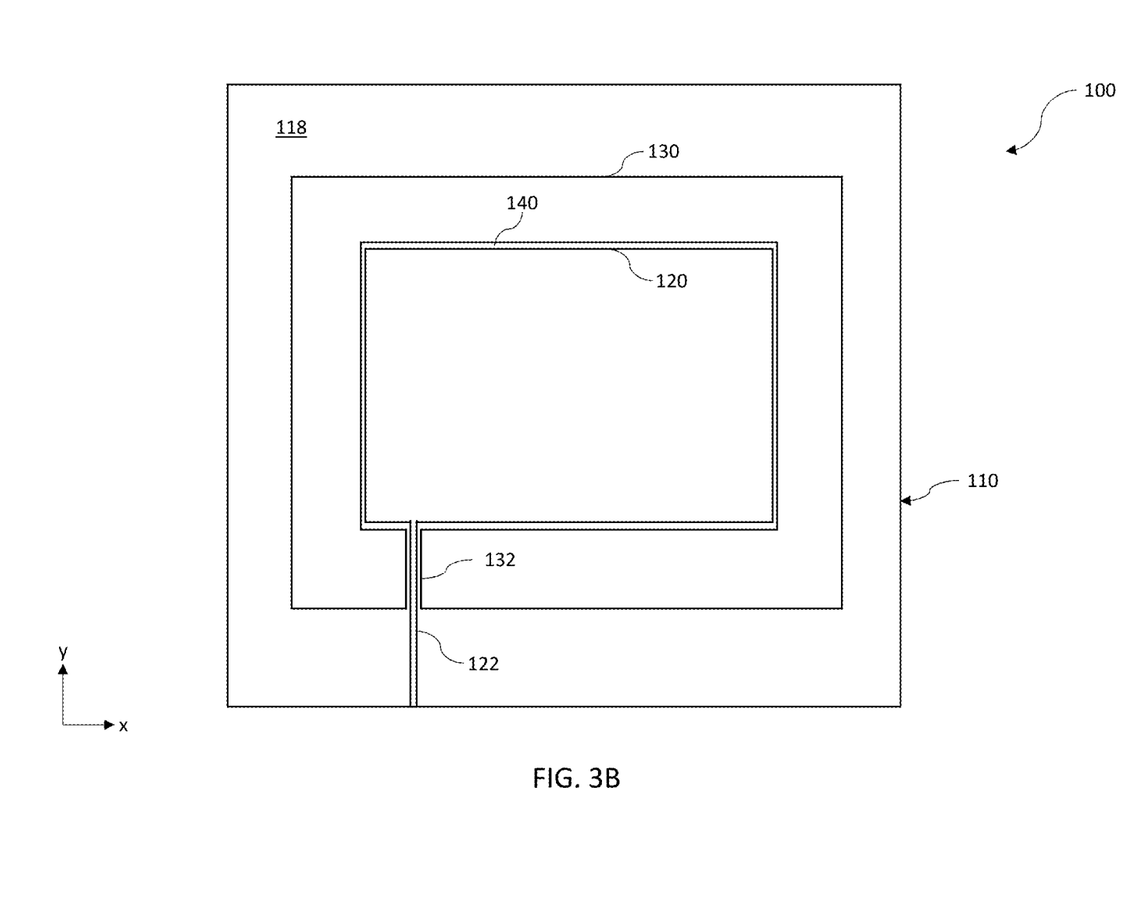
FIG. 3B is a top plan view of the resonator having multiple electrodes on the bottom surface of the piezoelectric layer according to the second exemplary embodiment of the present disclosure.
Figure 3C:
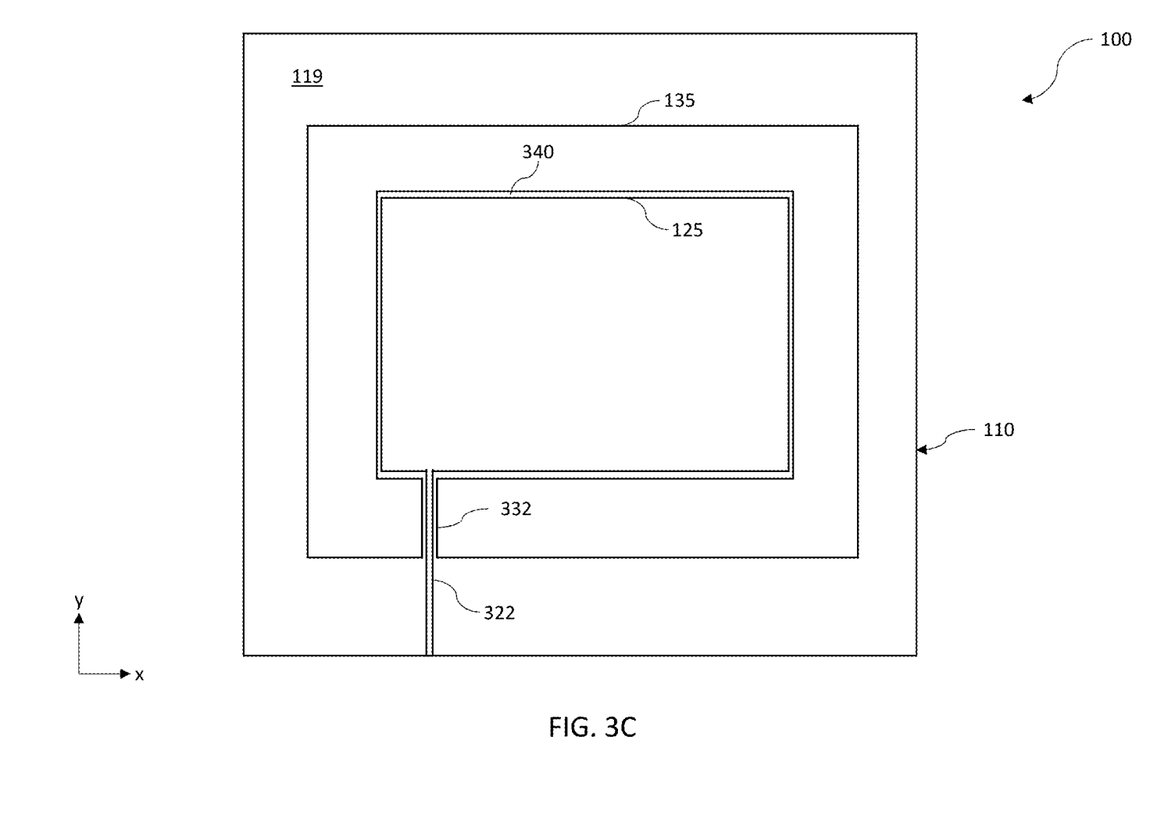
FIG. 3C is a bottom plan view of the resonator having multiple electrodes on the bottom surface of the piezoelectric layer according to the second exemplary embodiment of the present disclosure.

Referring now to FIGS. 2A-2C and 3A-3C, the bottom surface 119 of the resonator 100 of FIG. 1 may have single or multiple electrode patterns. While FIGS. 2A-2C depict one exemplary embodiment of the resonator 100 with one bottom electrode, FIGS. 3A-3C depict another exemplary embodiment of the resonator 100 having two bottom electrodes: inner and outer electrodes.

A resonator according to a first embodiment of the present disclosure having one electrode on the bottom surface of the piezoelectric layer 110 will be described by referring to FIGS. 2A-2C.

FIG. 2A is a cross-sectional view of the resonator 100 having one electrode on the bottom surface of the piezoelectric layer 110 according to the first exemplary embodiment of the present disclosure, FIG. 2B is a top plan view of the resonator 100 having one electrode on the bottom surface of the piezoelectric layer 110 according to the first exemplary embodiment of the present disclosure, and FIG. 2C is a bottom plan view of the resonator 100 having one electrode on the bottom surface of the piezoelectric layer 110 according to the first exemplary embodiment of the present disclosure, using the same components and numerals as in FIG. 1. Here, the same descriptions of the resonator, the piezoelectric layer, the mesa, the inner electrode, the outer electrode, and the gap between the inner and outer electrodes as those in the embodiment of FIG. 1 will be omitted.

In the first embodiment depicted in FIGS. 2A-2C, one electrode 150 is disposed on the bottom surface 119 of the piezoelectric layer 110. This embodiment may advantageously allow great latitude in the use of, and electrical connection to, the bottom electrode 150. Additionally, this makes manufacturing easier than that of the two-bottom-electrode (125/135) patterns of the second exemplary embodiment shown in FIGS. 3A-3C.

The bottom electrode 150 may be left floating or may be connected to ground or a sustaining circuit. The bottom electrode 150 may be connected to the first outer electrode 130 disposed on the top surface 118 of the piezoelectric layer 110 so that no electric field can be developed across them from stray charges.

A via 200 may be formed through the piezoelectric layer 110 to allow electrical contact between the first outer electrode 130 disposed on the top surface 118 of the piezoelectric layer 110 and the bottom electrode 150 of the piezoelectric layer 110. The via 200 typically is a hole in the quartz which is filled either partially or completely with a metal.

The bottom surface 119 of the piezoelectric layer 110 may have a mesa 113 for extra modal confinement, for example, for a small VHF design. The mesa 113 is a raised region of the piezoelectric layer 110 as shown in FIG. 2A. The length (x) and width (y) of the mesa 113 may be the same as those of the bottom electrode 150. The thickness (z) of the mesa 113 may be, for example, but not limited to, 1-2 μm.

With reference to FIG. 2, the entire electrode pattern including the first inner electrode 120, the first outer electrode 130, and the bottom electrode 150 may contribute to the modal stability over temperature, and may be used for determining modal confinement, quality factor Q, and resonant frequency and f/T profiles. The sizes of the first inner electrode 120 may determine a motional resistance $R_1$ of the resonator 100. The mesas 112 and 113 may be also used for extra modal confinement.

A typical operation of the resonator 100 with a single electrode on the bottom surface 119 of the piezoelectric element 110, according to the first embodiment of the present disclosure, will be discussed with reference to FIGS. 2A-2C. An input signal from the circuit 610 of FIG. 4B is electrically coupled to the first inner electrode 120. Due to the physical property of piezoelectric material, the first inner electrode 120 generates an electro-magnetic field within a vibrating region 114 (shown in FIGS. 2A and 3A) causing an excitation voltage within the vibrating region 114. The vibrating region 114 may generate an acoustic energy within the piezoelectric layer 110. The vibrating region 114 may be generally between the first inner electrode 120 of the top surface 118 of the piezoelectric layer 110 and the bottom electrode 150, and may be adjacent to the resonating region 116. Each acoustical wave propagates outward from the vibrating region 114 and starts to excite a resonating region 116 (shown in FIGS. 2A and 3A). The first outer electrode 130 and the bottom electrode 150 trap acoustic energy within the resonating region 116. The resonating region 116 provides a region to trap acoustic energy and confine the acoustic energy to the resonating region 116, which minimizes acoustic energy leakage and provides a high quality factor Q. The resonating region 116 may be under the first inner electrode 120 and may spread under the first outer electrode 130.

A resonator according to a second embodiment of the present disclosure having multiple electrodes on the bottom surface of the piezoelectric layer 110 will be described by referring to FIGS. 3A-3C. FIG. 3A is a cross-sectional view of the resonator 100 having multiple electrodes on the bottom surface of the piezoelectric layer 110 according to the second exemplary embodiment of the present disclosure, FIG. 3B is a top plan view of the resonator 100 having multiple electrodes on the bottom surface of the piezoelectric layer 110 according to the second exemplary embodiment of the present disclosure, and FIG. 3C is a bottom plan view of the resonator 100 having multiple electrodes on the bottom surface of the piezoelectric layer 110 according to the second exemplary embodiment of the present disclosure, using the same components and numerals in FIG. 1. Here, the same descriptions of the resonator, the piezoelectric layer, the mesa, the inner electrode, the outer electrode, and the gap between the inner and outer electrodes as those in the embodiment of FIG. 1 will be omitted.

In the second embodiment illustrated in FIGS. 3A-3C, two separate electrodes, a second inner electrode 125 and a second outer electrode 135, may be disposed on the bottom surface 119 of the piezoelectric layer 110. The size and shape of the second inner and outer electrodes 125 and 135 patterned on the bottom surface 119 of the piezoelectric layer 110 may be the same as, or different from, those of the first inner and outer electrodes 120 and 130 patterned on the top surface 118 of the piezoelectric layer 110.

The second inner electrode 125 may be disposed on the bottom surface 119 of the piezoelectric layer 110. The second inner electrode 125 may be connected to the circuit 610 shown in FIG. 4B, and may be used for charge collection and causing a piezoelectric resonance.

The second outer electrode 135 may surround a part or a whole of the second inner electrode 125. The second outer electrode 135 may be left floating or may be connected to ground or the sustaining circuit. Further, the second outer electrode 135 may be connected to the second inner electrode 125. The second outer electrode 135 disposed on the bottom surface 119 of the piezoelectric layer 110 may be connected to the first outer electrode 130 disposed on the top surface 118 of the piezoelectric layer 110 so that no electric field can be developed across them from stray charges.

The outer electrodes 130 and/or 135 may be configured for optimal modal confinement of an acoustic resonance while the inner electrodes 120 and/or 125 may be configured to produce a higher motional resistance than the interconnect resistance for maintaining high Q. Motional resistance of the resonator 100 may be larger than interconnect resistance of the resonator 100.

A via 300 may be formed through the piezoelectric layer 110 to allow electrical contact between the first outer electrode 130 disposed on the top surface 118 of the piezoelectric layer 110 and the second outer electrode 135 of the piezoelectric layer 110. The via 300 typically is a hole in the quartz or piezoelectric material which is filled either partially or completely with a metal.

The second outer electrode 135 may have a structure 332 allowing a conductive lead 322 to connect the second inner electrode 125 and the circuit 610. The conductive lead 322 can allow the second inner electrode 125 to electrically access the circuit 610 (shown in FIG. 5B). The structure 332 of the second outer electrode 135 for the conductive lead 322 may be formed as a discontinuous part of the second outer electrode 135, a groove covered with electrically insulating material formed on the second outer electrode 135, or any structure providing a space that the conductive lead 322 can extend from the second inner electrode 125 to the circuit 610.

The second inner electrode 125 and the second outer electrode 135 may be separated by a gap 340. The gap 340 may be smaller than an acoustic wavelength so as not to disturb the modal pattern. For instance, the gap 340 may be 10 μm or less. The dimensions of the gap 340 between the second inner electrode 125 and the second outer electrode 135 of the bottom surface 119 of the piezoelectric later 110 may be the same as those of the gap 140 between the first inner electrode 120 and the first outer electrode 130 of the top surface 118 of the piezoelectric layer 110. Alternatively, the dimensions of the gap 340 between the second inner electrode 125 and the second outer electrode 135 may be different from those of the gap 140 between the first inner electrode 120 and the first outer electrode 130.

The bottom surface 119 of the piezoelectric layer 110 may have a mesa 113 for extra modal confinement, for example, for a small VHF design. The mesa 113 is a raised region of the piezoelectric layer 110 as shown in FIG. 3A. The length (x) and width (y) of the mesa 113 may be the same as, or different from, those of the second outer electrode 135. The thickness (z) of the mesa 113 may be, for example, but not limited to, 1-2 μm.

A typical operation of the resonator 100 with two electrodes on the bottom surface 119 of the piezoelectric element 110, according to the second embodiment of the present disclosure, will be discussed with reference to FIGS. 3A-3C. An input signal from the circuit 610 of FIG. 5B is electrically coupled to the first and second inner electrodes 120 and 125. Due to the physical property of piezoelectric material, the first and second inner electrodes 120 and 125 generate an electro-magnetic field within the vibrating region 114 causing an excitation voltage within the vibrating region 114. The vibrating region 114 may generate an acoustic energy within the piezoelectric layer 110. The vibrating region 114 may be generally between the first inner electrode 120 of the top surface 118 and the second inner electrode 125 of the bottom surface 119, and may be adjacent to the resonating region 116. Each acoustical wave propagates outward from the vibrating region 114 and starts to excite the resonating region 116. The first and second outer electrodes 130 and 135 trap acoustic energy within the resonating region 116. The resonating region 116 provides a region to trap acoustic energy and confine the acoustic energy to the resonating region 116, which minimizes acoustic energy leakage and provides a high quality factor. The resonating region 116 may be between the inner electrodes 120 and 125 and may spread to an area between the outer electrodes 130 and 135.

The entire electrode pattern, including the first and second inner electrodes 120 and 125 and the first and second outer electrodes 130 and 135, may contribute to the modal stability over temperature, and may be used for determining modal confinement, quality factor Q, and frequency setting, such as f/T profiles. The sizes of the first and second inner electrodes 120 and 125 may determine a motional resistance $R_1$ of the resonator 100. The mesas 112 and 113 may be also used for extra modal confinement.

FIG. 5A illustrates a top view of the resonator 100 with a tether 500 according to an embodiment of the present disclosure. The tether may have various shapes. For example, the tether may have a rectangular parallelepiped shape, or, as shown in FIG. 5A, the tether 500 may be formed as bent or curved legs, for example, as C-shape and bracket shapes.

The structure of the resonator 100 may be suspended using, for instance, the tether 500. The tether 500 may be defined in the same piezoelectric layer 110 that makes up the resonator structure 100. An extension part 520 of the piezoelectric layer 110 may couple a piezoelectric plate 510 to the tether 500. The width of extension part 520 of the piezoelectric layer 110 may be 540 µm. The tether 500 and/or the extension part 520 of the piezoelectric layer 110 may be thicker than the piezoelectric plate 510. The extension part 520 of the piezoelectric layer 110 and the tether 500 may have the same thickness.

Mechanical mounts 530 may be attached to each of the ends of the tether 500. The bottom side of the mechanical mounts 530 may be fixed to an anchor, a base wafer or any other substrate.

A via 551 permits electrical contact between conductive lead 122 and inner electrode 120 on the top surface of resonator 100 with a bond pad 571 on the bottom surface of resonator 100 and with circuit 610, as illustrated in FIG. 5B. Similarly, a via 550 permits electrical contact between outer electrode 130 on the top surface of resonator 100 with a bond pad 572 on the bottom surface. Second inner electrode 125 may, or may not, be in electrical contact with second out electrode 135 by means of lead 560. That, is, while the embodiment displayed in FIG. 5B includes a lead 560, an alternate embodiment may not have a lead 560.

Figure 5:
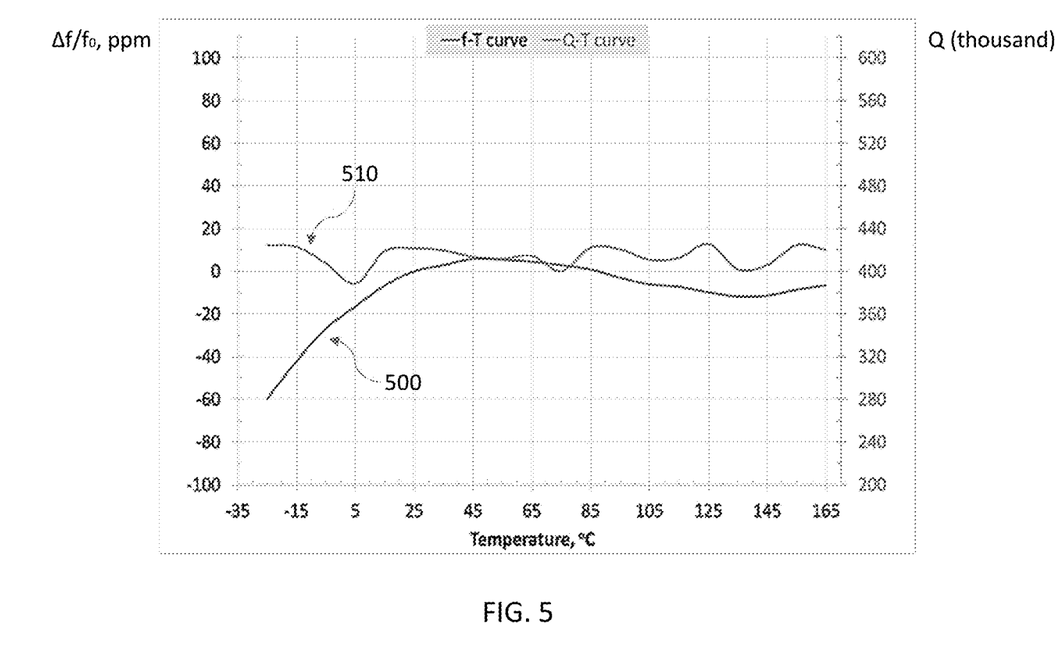
FIG. 5 is a graph showing spectrums of the f/T profile and the quality factor Q over temperature according to one exemplary embodiment of the present disclosure.
Figure 6:
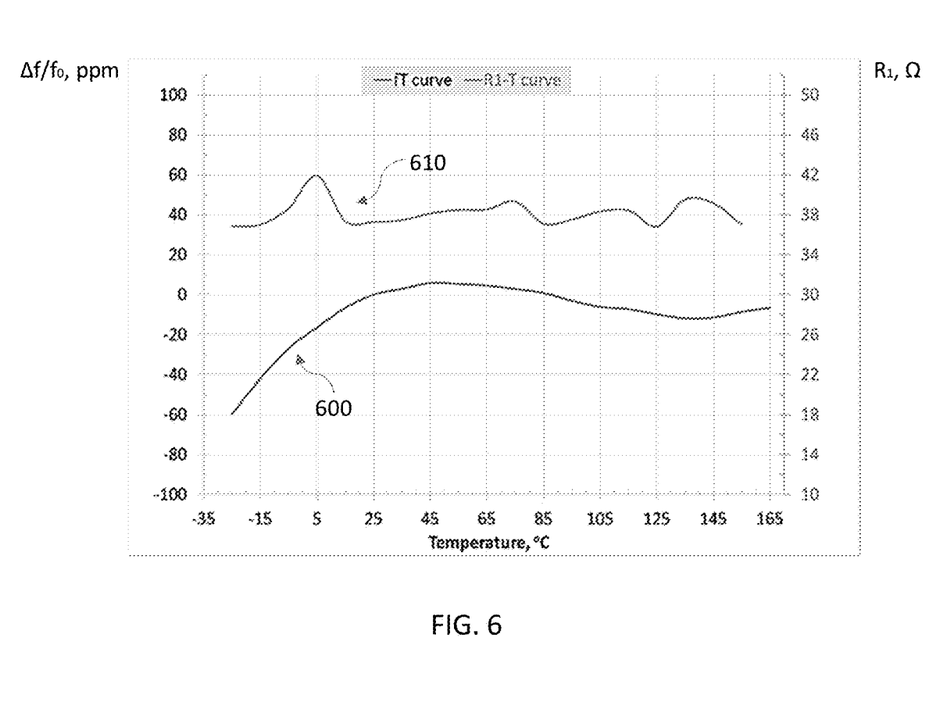
FIG. 6 is a graph showing spectrums of the f/T profile and the motional resistance $R_1$ of the resonator over temperature according to one exemplary embodiment of the present disclosure.

FIG. 5 is a graph showing spectrums of the f/T profile and the quality factor Q over temperature according to one exemplary embodiment of the present disclosure. As shown in FIG. 6, there are no major activity dips in the spectrum of the f/T profile (500) and the spectrum of the quality factor Q (510) over temperature. FIG. 6 is a graph showing spectrum of the f/T profile (600) and the spectrum of the motional resistance $R_1$ of the resonator 100 (610) over temperature according to one exemplary embodiment of the present disclosure. As shown in FIG. 7, the embodiment of the present disclosure may have high motional resistance $R_1$. For this analysis, the following dimensions were used: the length (x) of the quartz plate=1980 µm, the width (y) of the quartz plate=1860 µm, the thickness (z) of the quartz plate=53 µm, the length (x) of the mesa=1715 µm, the width (y) of the mesa=1495 µm, the thickness (z) of the mesa=2 µm, the length (x) of the electrode=700 µm, the width (y) of the electrode=600 µm, the thickness (z) of the electrode=0.08 µm, theta of the cut angle=33.9°, and phi of the cut angle=21.629°.

In FIGS. 1-4, the electrodes are each illustrated as formed as a rectangular shape. However, one skilled in the art will understand that there are many other shapes and structures, for example, but not limited to, circle, oval or polygon shapes which might perform in the present disclosure with similar results, provided the teachings of the present disclosure are incorporated therein.

Although the example embodiments have been described in detail, it should be understood that various changes, substitutions and alterations can be made herein without departing from the spirit and scope of the application as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding embodiments described herein may be utilized according to the embodiments and alternative embodiments. Accordingly, the appended claims are intended to include within their scope such processes, machines, manufacture, compositions of matter, means, methods, or steps.

What is claimed is:

1. A resonator, comprising:
    a piezoelectric layer comprising a piezoelectric material, the piezoelectric layer having a first surface and a second surface;
    an inner electrode disposed on the first surface of the piezoelectric layer, the inner electrode connected to a circuit;
    an outer electrode surrounding the inner electrode on the first surface of the piezoelectric layer, the outer electrode left floating or connected to ground;
    an other inner electrode disposed on the second surface of the piezoelectric layer, the other inner electrode connected to the circuit; and
    an other outer electrode surrounding the other inner electrode on the second surface of the piezoelectric layer, the other outer electrode left floating, connected to ground, or connected to the circuit,
    wherein the inner electrode and the outer electrode are separated by at least one first gap smaller than an acoustic wavelength, and wherein the other inner electrode and the other outer electrode are separated by at least one second gap smaller than the acoustic wavelength.

2. The resonator of claim 1, wherein the outer electrode on the first surface of the piezoelectric layer and the other outer electrode on the second surface of the piezoelectric layer are electrically connected.

3. The resonator of claim 2 further comprising a via formed through the piezoelectric layer to electrically connect between the outer electrode on the first surface of the piezoelectric layer and the other outer electrode on the second surface of the piezoelectric layer.

4. The resonator of claim 1, wherein the outer electrode on the first surface of the piezoelectric layer and the other outer electrode on the second surface of the piezoelectric layer are electrically connected.

5. The resonator of claim 4, further comprising a via formed through the piezoelectric layer to electrically connect between the outer electrode on the first surface of the piezoelectric layer and the other outer electrode on the second surface of the piezoelectric layer.

6. The resonator of claim 1, wherein the piezoelectric layer comprises at least one mesa which is a raised region of the piezoelectric layer on the first or second surface.

7. The resonator of claim 6, wherein the at least one mesa has the same length and width as the outer electrode.

8. The resonator of claim 1, further comprising a heater disposed on the first or second surface of the piezoelectric layer.

9. The resonator of claim 8, further comprising a temperature sensor disposed on the first or second surface of the piezoelectric layer.

10. The resonator of claim 1, wherein the piezoelectric material comprises quartz, aluminum nitride or lithium niobate.

11. The resonator of claim 1, wherein the outer electrode comprises a structure formed such that a lead connecting the inner electrode and the circuit can extend through the outer electrode from the inner electrode to the circuit.

12. The resonator of claim 11, wherein the structure of the outer electrode comprises a discontinuous part or a groove.

13. The resonator of claim 1, wherein the other outer electrode comprises a discontinuous part or groove for a lead connecting the other inner electrode and the circuit.

14. The resonator of claim 1, wherein the at least one first gap between the inner electrode and the outer electrode is 10 µm or less.

15. The resonator of claim 1, wherein the at least one second gap between the other inner electrode and the other outer electrode is 10 µm or less.

16. The resonator of claim 1, wherein the piezoelectric layer comprises a tether suspending a structure of the piezoelectric layer.

17. The resonator of claim 1, wherein the at least one second gap between the other inner electrode and the other outer electrode of the second surface of the piezoelectric layer has the same dimension as the at least one first gap between the inner electrode and the outer electrode of the first surface of the piezoelectric layer.

18. The resonator of claim 1, wherein the at least one second gap between the other inner electrode and the other outer electrode of the second surface of the piezoelectric layer is different from the at least one first gap between the inner electrode and the outer electrode of the first surface of the piezoelectric layer.

19. The resonator of claim 1, wherein the piezoelectric material is SC-cut quartz and the resonator is configured to operate in a shear-mode fashion.

20. The resonator of claim 1, wherein motional resistance of the resonator is larger than interconnect resistance of the resonator.

* * * * *